(12) United States Patent
Arasawa et al.

(10) Patent No.: US 7,468,870 B2
(45) Date of Patent: Dec. 23, 2008

(54) MAGNETORESISTIVE HEAD, WITH SECOND MAGNETIC DOMAIN CONTROL LAYERS AND MANUFACTURING METHOD THEREOF

(75) Inventors: Masatoshi Arasawa, Kanagawa (JP); Wataru Kimura, Kanagawa (JP); Shuichi Kojima, Kanagawa (JP); Koji Okazaki, Kanagawa (JP); Norihiro Ookawa, Kanagawa (JP)

(73) Assignee: Hitachi Global Storage Technologies Netherlands B.V., AZ Amsterdam (NL)

( * ) Notice: Subject to any disclaimer, the term of this patent is extended or adjusted under 35 U.S.C. 154(b) by 416 days.

(21) Appl. No.: 11/317,881

(22) Filed: Dec. 22, 2005

(65) Prior Publication Data

US 2006/0158793 A1 Jul. 20, 2006

(30) Foreign Application Priority Data

Dec. 24, 2004 (JP) ............................. 2004-372901

(51) Int. Cl.
G11B 5/39 (2006.01)
(52) U.S. Cl. ................................. 360/324.12
(58) Field of Classification Search ............ 360/324.12, 360/324.1, 324.11, 324.2
See application file for complete search history.

(56) References Cited

U.S. PATENT DOCUMENTS 6,914,760 B2 * 7/2005 Gill ....................... 360/324.12
7,016,164 B2 * 3/2006 Gill ....................... 360/324.11
7,154,714 B2 * 12/2006 Fukui et al. ............ 360/324.12
2004/0047087 A1 3/2004 Fukui et al.
2004/0207963 A1 * 10/2004 Gill ....................... 360/324.12

FOREIGN PATENT DOCUMENTS

JP 2004-103120 2/2004

* cited by examiner

Primary Examiner—Jefferson Evans
(74) Attorney, Agent, or Firm—Townsend and Townsend and Crew LLP; Rambod Nader (57) ABSTRACT

Making thinner the magnetic domain control layer deteriorates the magnetic properties. Also, disturbances tend to increase the magnetization dispersion of the magnetic domain control layer, thereby lowering the magnetic domain control bias magnetic field. In one embodiment of the invention, a first magnetic domain control layer is provided in the proximity of the free layer of the GMR sensor in such a way that the track width is Twr1. Outside the first magnetic domain control layer is provided a second magnetic domain control layer. The second magnetic domain control layer placed outside the first magnetic domain control layer gives the first magnetic domain control layer an external bias field. The amount of magnetization of the tip of the first magnetic domain control layer is polarized and increased by the bias magnetic field from the second magnetic domain control layer. This causes the first magnetic domain control layer to apply a strong bias magnetic field having a lower dispersion to the free layer of the GMR sensor.

22 Claims, 8 Drawing Sheets

(b)
Magnetization state of the first domain control layer

MAGNETORESISTIVE HEAD, WITH SECOND MAGNETIC DOMAIN CONTROL LAYERS AND MANUFACTURING METHOD THEREOF

CROSS-REFERENCES TO RELATED APPLICATIONS

This application claims priority from Japanese Patent Application No. JP2004-372901, filed Dec. 24, 2004, the entire disclosure of which is incorporated herein by reference.

BACKGROUND OF THE INVENTION

The present invention relates to a magnetoresistive head and manufacturing method thereof, and a read write separation type head in which a magnetoresistive head is installed, and in particular to a structure of the magnetic domain control layer of a magnetoresistive head.

A magnetic head used in a magnetic storage device (hard disk drive) has a recording head unit which records signal information in a magnetic recording medium (hard disk) as magnetization information, and a read head which transforms the magnetization information recorded in the magnetic recording medium into signal information and reads it. A magnetic recording medium is required to increase a recording information capacity, improve the transformation rate, and decrease the error rate, and so the magnetic recording density is being improved from year to year. The improvement of the magnetic recording density lowers the volume of unit magnetic information recorded in the magnetic recording medium, which in turn decreases the amount of magnetization of magnetic information per unit; as a result, the read head needs higher sensitivity than in the past. At the same time, generally as the recording density is improved, noises of the magnetic recording medium and the read head and also instability of read signals are increased. Accordingly, today, the read head needs low noise and signal stabilizing technology more than ever.

The read head includes a magnetoresistive stack due to requirements of high sensitivity in high recording density and reads signals through the use of the magnetoresistive effect, and is thus called a magnetoresistive head. The stack structures of the magnetoresistive heads nave various types and are classified into a GMR head, a CPP-GMR head, a TMR head, and other heads on the basis of their using magnetoresistive principles; they are being studied based on the classifications. The heads respectively make use of the GMR (Giant Magnetoresistive effect), the CPP-GMR (Current Perpendicular Plane GMR effect), and the TMR (Tunneling Magnetoresistive effect) and output as voltage changes from input magnetic fields which enter the read head from the magnetic recording medium.

Each of these magnetoresistive heads includes a magnetic sensor unit having a pinned layer in which the magnetization direction is fixed, a nonmagnetic layer formed by making contact with the pinned layer, and a free layer formed by coming in contact with the nonmagnetic layer, and the end of the magnetic sensor unit. The end has a magnetic domain control layer which controls the magnetization direction of the free layer and an electrode layer which flows a current into the magnetic sensor unit. The magnetic sensor has a ferromagnetic shield layer disposed in the upper and lower portions thereof. The free layer utilizes the input magnetic field from magnetic information recorded in the recording medium for the change of the magnetization direction. When the magnetization direction of the free layer is changed, the difference between the free layer and the pinned layer directions alters the resistance of the magnetic sensor unit. The hard disk drive has a construction in which the resistance change is read in the form of an electrical signal. This requires causing a current to flow for the reading of the resistance change in the magnetic sensor unit, so that the magnetic sensor end is provided with an electrode layer together with a magnetic domain control layer.

The magnetic domain control layer is disposed in the free layer end and has a structure in which it applies a bias magnetic field to the free layer. This is because although the magnetization direction of the free layer is constructed so as to be changed sensitively with a very weak recording magnetic field of information recorded in the recording medium, bias magnetic field application is required for the guarantee of reproducibility and stability of the magnetic conditions when the free layer is changed between the initial magnetic conditions and the magnetic conditions receiving recording magnetic field input. In other words, the free layer, whose magnetization is rotated by receiving input magnetic field from the magnetic recording medium, is not made a single domain. If the free layer has a magnetic domain, the magnetic domain wall is moved, which leads to causes of a variety of noises such as the Barkhausen noise, and which loses the reproducibility of the magnetic conditions between the initial magnetic conditions and the magnetic conditions receiving recording magnetic field input resulting in phenomena such as output variation, thereby being incapable of signal reproduction. In order that the magnetic domain of the free layer is made a single magnetic domain, the magnetic domain control layer has a structure in which a bias magnetic field is applied to the free layer.

The magnetic sensor unit is placed within a magnetic shielding layer so as to sensitively react only with a very weak recording magnetic field recorded in the recording medium, not to be affected by other external magnetic fields, and to efficiently guide the medium recording magnetic field to the free layer of the magnetic sensor unit. The magnetic sensor unit and the magnetic domain control layer and the electrode layer disposed outside both ends thereof need to be electrically shielded from the magnetic shield layer disposed on the upper and lower portions thereof, and thus the space between the layers are comprised of an electrically insulating material.

Requirements of high sensitivity concerning the read head in high recording density, reduction of noise, and signal stabilization stimulates not only studies on improvement of the magnetic sensor unit, but also various investigations of magnetic domain control layers, electrode layers and shielding layers. For instance, Patent Document 1 (Japanese Patent Laid-Open No. 2004-103120) proposes an approach in which the adoption of a differential bias method for the magnetic domain control layer enables the application of an appropriate bias magnetic field by means of the free layer. The differential bias construction, which uses two magnetic domain control layers, is a system which involves directing the magnetization of the free layer to a given direction in a first magnetic domain control layer, providing the second magnetic domain control layer slightly separated from the first magnetic domain control layer, and directing the magnetization of the second magnetic domain control layer to the opposite direction of the first magnetic domain control layer for the application of a bias magnetic field. This approach is considered to maintain high a bias magnetic field of the end of a magnetoresistive stack, to be capable of achieving a bias magnetic field distribution which rapidly decreases toward the center of the magnetoresistive stack, and to be effective in high output as well as to readily attain stabilization of a read output because of being capable of causing the free layer to be efficiently made single magnetic domain.

Also, Patent Document 2 (Japanese Patent Laid-Open No. 2004-119534) discloses an intermediate stop hard bias construction and manufacturing process thereof for improvement of characteristics of the magnetic domain control layer in the free layer end and also for an appropriate application of the bias magnetic field of the magnetic domain control layer to the free layer. In this intermediate stop hard bias construction, setting equal the position of the heights of the free layer and the magnetic domain control layer makes small the layer thickness of the magnetic domain control layer, thereby localizing a bias magnetic field from the magnetic domain control layer and minimizing, in an attempt to simultaneously achieve the high output and stabilization of a read head signal. Moreover, in the description of Patent Document 2, this construction makes use of a Cr underlying layer when a Co alloy layer is used as an improved material of the magnetic domain control layer, and utilizes a metal amorphous seed layer to further regulate the crystalline structure of the Cr underlying layer. Furthermore, in the description of Patent Document 2, the thinner the layer of the metal amorphous seed layer and the Cr underlying layer, the better it is, in the range of the coercivity and the squareness of the Co alloy layer being maintained high, for improvement of the hard bias characteristics. Further, the higher the saturation magnetic flux density and the residual magnetic flux density of the Co alloy layer and also the thinner the layer of the Co alloy layer, the better it is.

Patent Document 1 above proposes a differential bias method which makes the magnetic layer construction two layers as an improved material of the magnetic domain control layer; however, this method is difficult to adopt since no space is present for the formation of many thin layers in the end of the magnetoresistive stack (GMR layer).

In Patent Document 2, an attempt is made to improve the characteristics of the magnetic domain control layer for the improvement of the characteristics of the read head, but making thin the layer of the magnetic domain control layer is limited, having shown that improvement of the read head characteristics exhibits limitations.

Limitations of the Composition Characteristics of the Co Alloy Magnetic Layer

As described in Patent Document 2, the magnetic domain control layer includes a Co alloy magnetic layer and a Cr underlying layer, and a metal amorphous seed layer which controls its crystalline structure on account of the need for a high coercivity and a high magnetic flux density. The examples set forth therein include cases which make use of a CoCrPt alloy magnetic layer, a Cr underlying layer and an NiTa alloy amorphous seed layer. Also, at the same time, the document describes an approach which involves altering the content of the Cr and Pt additional elements of the CoCrPt magnetic layer for the purpose of attaining a high magnetic flux density, thereby having realized the magnetic properties of a high magnetic flux density to have improved magnetic domain controllability. The Cr composition and the Pt composition are added for the purposes of the improvement of coercivity while maintaining a high magnetic flux density and also the improvement of corrosion resistance and the adjustment of the saturation magnetic flux density. The characteristics of the magnetic domain control layer which is excellent include Co alloy compositions which show a high saturation magnetic flux density Bs, a high residual magnetic flux density Br and a high coercivity Hc. The free layer comprises a CoFe alloy and an NiFe alloy film, and the saturation magnetic flux density Bs is from 1T inclusive to 2T. Therefore the residual magnetic flux density of the magnetic domain control layer preferably seems to be 1T or higher. In addition, the coercivity Hc of the magnetic domain control layer is preferably 80 kA/m or more and its low limit is thought to be from 64 kA/m to 48 kA/m.

However, limitations have come to be apparent for the formation of a magnetic domain control layer which simultaneously offers a high saturation magnetic flux density Bs, a high residual magnetic flux density Br and a high coercivity Hc by the preparation of a Co alloy composition. More specifically, the amounts of the Cr composition and the Pt composition must be decreased in order to obtain a high saturation magnetic flux density Bs and a high residual magnetic flux density Br, but if the compositions are decreased, the coercivity Hc is lowered. The coercivity Hc of a CoCrPt film greatly varies depending on the Pt composition, in particular the coercivity Hc is clearly rapidly lowered when the Pt content is 10 at % or less. In other words, although the adjustment of the additional element composition of a Co alloy magnetic layer readily forms a magnetic domain control layer of a high coercivity Hc, a low saturation magnetic flux density Bs and a low residual magnetic flux density Br, and a magnetic domain control layer of a high coercivity Hc, a low saturation magnetic flux density Bs and a low residual magnetic flux density Br, it has apparently become difficult to obtain a magnetic domain control layer of a high coercivity (Hc≧120 kA/m), a high saturation magnetic flux density Bs and a high residual magnetic flux density Br(Br≧1T).

Problems of Degradation of Magnetic Properties During Making Co Alloy Magnetic Layer Thin Additionally, Patent Document 2 points out that the magnetic domain controllability of a free layer is lowered because of the deterioration of magnetic properties of a magnetic domain control layer formed on the GMR layer end, and describes an approach which avoids a decrease in its magnetic properties. Moreover, the document also sets forth that in the proximity of the GMR layer end, the magnetic domain control layer is thin as compared with an even portion on account of the manufacturing method thereof.

Figure 9:
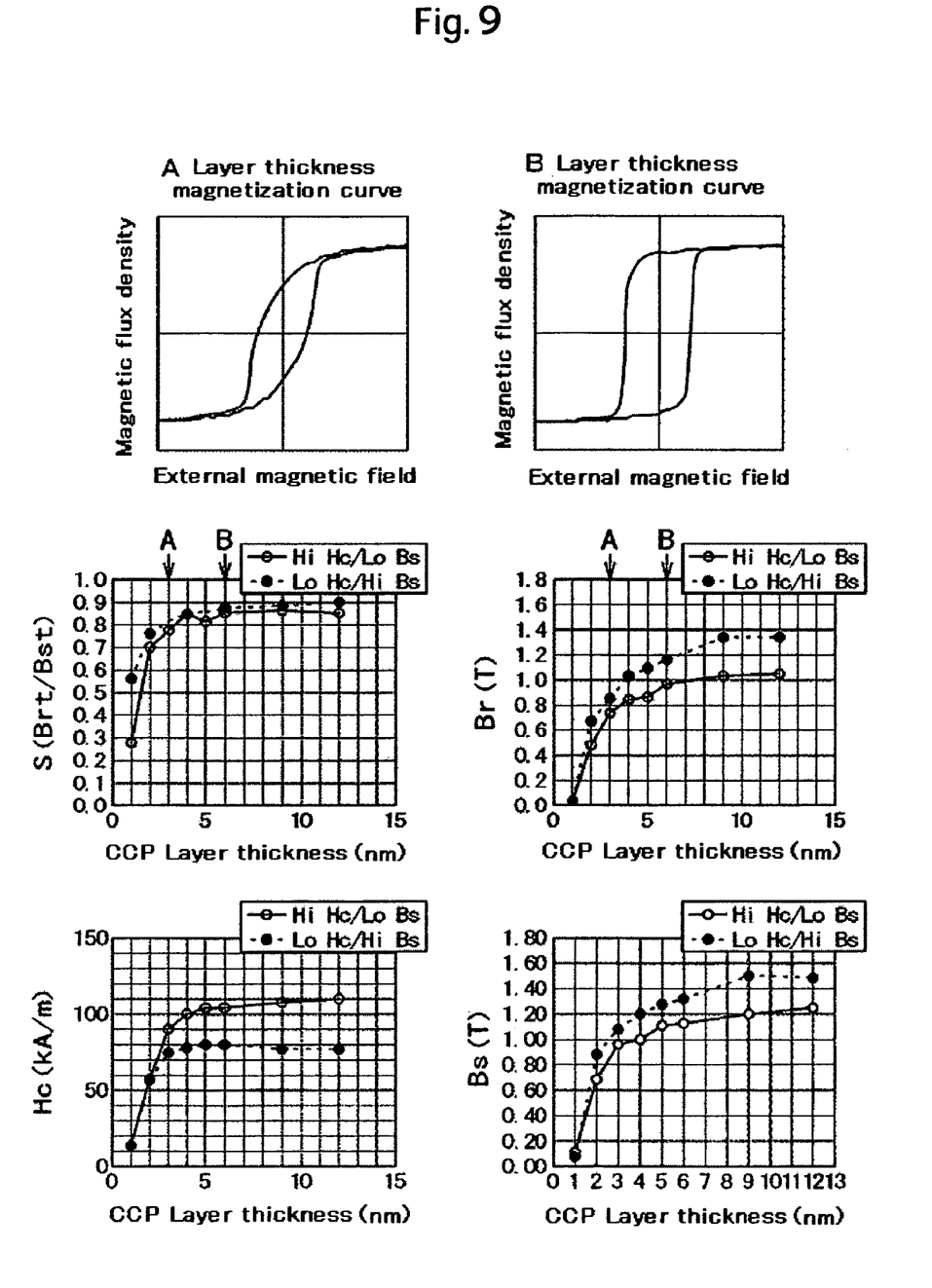
FIG. 9 shows graphs indicating the dependency of magnetostatic properties (coercivity Hc, squareness S, saturation magnetic flux density Bs, residual magnetic flux density Br) of the magnetic domain control layer on the layer thickness.

In general, it is known that the magnetic properties of a CoCrPt/Cr base alloy magnetic layer decrease as the thickness of the magnetic layer is small. FIG. 9 indicates the results in the case where the dependency of the magnetic properties on the layer thicknesses of magnetic layers was investigated when the Cr content and the Pt content of a CoCrPt alloy magnetic layer are changed. The Cr content and the Pt content are selected so that the magnetic flux density Bs and the coercivity are as high as possible. As the thickness of the CoCrPt magnetic layer is decreased, the coercivity Hc, the saturation magnetic flux density Bs, the residual magnetic flux density Br and the squareness S decrease. In particular, when the layer thicknesses are 3 nm or less, they rapidly decrease; for the layer thicknesses in the proximity of 1 nm, the characteristics of the hard magnetism disappeared. These characteristic degradation phenomena depend on thermal magnetic phenomena and the deterioration of the crystalline structure when Co alloy layers are made thin, so the phenomena are unavoidable even though the manufacturing process or the Co alloy composition is improved.

The problem of a deterioration in magnetic properties when the magnetic layer is made thin is estimated to also occur in a magnetic domain control layer in the proximity of the end of a GMR layer. More specifically, when the thickness of a magnetic domain control layer close to the end of a GMR layer is 3 nm or less, the magnetic properties of the magnetic domain control layer greatly lower, which is estimated to lead to a large decrease in magnetic domain control magnetic field to the free layer. In addition, when the thickness of the magnetic domain control layer is small, magnetic anisotropy energy KuV (Ku: magnetic anisotropy energy per volume, V: volume of crystal grain) greatly decreases, magnetic dispersion in the end of the magnetic domain control layer is likely to increase. As such, disturbances such as a temperature increase in magnetoresistive head actuation and an input magnetic field from the magnetic recording medium lower the magnetic domain control bias magnetic field to the free layer. This leads to malfunctions such as occurrences of Barkhausen noises and waveform variation, or enlargement of asymmetry of input.

Problems of Magnetic Domain Control Layer Intermediate Stop Structure

Patent Document 2 is directed to an invention which focuses attention on the improvement of the characteristics of the magnetic domain control layer. As a result, the document describes the improvement of the magnetic domain control characteristics by setting equal the position of the heights in the forming of the magnetic domain control layer and the free layer of the GMR layer. Also, the read head characteristics include as important characteristics the read head resistance characteristics as well as the magnetic domain control characteristics; the lower the read head resistance characteristics, the better it is. More specifically, sense current flows into the GMR sensor unit through the electrode layer formed on the upper portion of the magnetic domain control layer and then via the electrode layer and the bound portion between the magnetic domain control layer and the GMR layer end. If the electrode layer resistance is high or the electrode layer and the bound portion between the magnetic domain control layer and the GMR layer end are high, a temperature rise in the proximity of the GMR layer occurs due to the sense current, which leads to the generation of deterioration of the GMR characteristics and also the cause of noises. When the read track width is small, this detriment is increased.

On the other hand, when the read track width is small, the electrode layer formed in the GMR layer end renders the shape of the upper magnetic seed layer concave, and increases the average interval between the upper magnetic shield layer and the top surface of the GMR layer. It is well known that an increase in the average interval between the upper magnetic shield layer and the top surface of the GMR layer leads to a decrease in the read characteristics during magnetic read/write processing. Accordingly, the upper magnetic seed layer is preferably formed as even as possible and the upper magnetic shield layer must be avoided to be concave due to a thick electrode layer. Namely, the adoption of an intermediate stop structure limits the space in which the electrode layer is formed, being incapable of forming the electrode layer thick. As a result, apparently, a simple increase in the electrode layer thickness cannot make the read head resistance low. Making the magnetic domain control layer thin enables the electrode layer to be thick by a layer thickness made thin of the magnetic domain control layer, thereby readily obtaining low resistance characteristics. Hence, even when the magnetic layer thickness is small, there are required a magnetic domain control layer having good magnetic properties and high stability, and a forming method thereof.

The adoption of the intermediate stop structure described in Patent Document 2 attains great improvement in the magnetic domain control layer characteristics, but the structure has a disadvantage in that resistance is low in the electrode layer and the bound portion between the magnetic domain control layer and the GMR layer end.

BRIEF SUMMARY OF THE INVENTION

A feature of the present invention is to provide a magnetoresistive effect head excellent in magnetic domain control properties as compared with conventional structures and resistant to disturbances, by suppressing a decrease in a magnetic flux density generated by deterioration of the magnetic properties in the end of the magnetic domain control layer during the magnetic domain control layer being made thin as well as suppressing an increase in the magnetization dispersion of the magnetic domain control layer caused by disturbances such as a temperature increase and an external magnetic field.

Another feature of the present invention is to provide a method for manufacturing a magnetoresistive head excellent in magnetic domain control properties and resistant to disturbances.

Still another feature of the present invention is to provide a read write separation type magnetic head excellent in magnetic domain control properties and with a magnetoresistive head resistant to disturbances.

In accordance with an aspect of the present invention, a magnetoresistive head is characterized by including a lower magnetic shield layer, an upper magnetic shield layer, a magnetoresistive stack having a pinned layer, a nonmagnetic conductive layer and a free layer placed between the lower magnetic shield layer and the upper magnetic shield layer, first magnetic domain control layers placed in the proximity of the free layer outside both ends of the magnetoresistive stack, a first electrode layer placed on the upper portion of the first magnetic domain control layer, and second magnetic domain control layers placed outside both ends of the first magnetic domain control layers.

The second magnetic domain control layer preferably has a second electrode layer on the upper portion thereof.

Relations between a residual magnetic flux density Br1 and a coercivity Hc1 of the first magnetic domain control layer and a residual magnetic flux density Br2 and a coercivity Hc2 of the second magnetic domain control layer are preferably given by the relations Br1>Br2 and Hc1<Hc2.

A relationship between a Co composition $X_{Co1}$ of the first magnetic domain control layer and a Co composition $X_{Co2}$ of the second magnetic control layer is preferably given by the relation $X_{Co1}>X_{Co2}$.

A layer thickness t1 of the first magnetic domain control layer and a layer thickness t2 of the second magnetic domain control layer have preferably the relation t1<t2.

Preferably, the magnetoresistive stack has an underlying layer in the lower portion, the first magnetic domain control layer has a first underlying layer in the lower portion, the first underlying layer is disposed on any surface within the range of from the undersurface of the underlying layer to the undersurface of the free layer, the second magnetic domain control layer has a second underlying layer in the lower portion, and the second underlying layer is disposed on any surface within the range of from the undersurface of the underlying layer to the top surface of the first magnetic domain control layer.

Preferably, the magnetoresistive stack has an underlying layer in the lower portion, the first magnetic domain control layer has a first underlying layer in the lower portion, the first underlying layer is disposed on any surface within the range of from the undersurface of the underlying layer to the undersurface of the free layer, and the second underlying layer is disposed on any surface within the range of from the top surface of the first underlying layer to the top surface of the first magnetic domain control layer.

Preferably, the magnetoresistive stack has an underlying layer in the lower portion, the first magnetic domain control layer is disposed on any surface within the range of from the undersurface of the underlying layer to the undersurface of the free layer, the second magnetic domain control layer has a second underlying layer in the lower portion, and the second underlying layer is formed on any surface within the range of from the undersurface of the underlying layer to the top surface of the first magnetic domain control layer.

The second magnetic domain control layer may also be placed on the outer end of the first magnetic domain control layer.

In accordance with another present invention, a method for manufacturing a magnetoresistive head comprises forming a lower insulating gap layer on the upper portion of a lower magnetic shield layer; layer-forming on the upper portion of the lower magnetic shield layer a magnetoresistive stack having a underlying layer, an antiferromagnetic layer, a pinned layer, a nonmagnetic spacer layer and a free layer, and then forming a 11th lift off resist layer on a portion of the magnetoresistive stack; cutting off an area not covered with the first lift off resist layer from the lower surface of the underlying layer to any surface within the range of the lower surface of the free layer of the magnetoresistive stack, and removing; forming a first underlying layer, a first magnetic domain control layer and a first electrode layer in the area not covered with the first lift off resist layer; removing the first lift off resist layer; forming a second lift off resist layer on portions of the upper portions of the magnetoresistive stack and the first electrode layer; cutting off an area not covered with the second lift off resist layer from the lower surface of the underlying layer to any surface within the range of the top surface of the magnetic domain control layer of the magnetoresistive stack, and removing; forming a second underlying layer and a second magnetic domain control layer in the area not covered with the second lift off resist layer; removing the second lift off resist layer; forming an upper insulating gap layer over the upper portion of the magnetoresistive stack, the second electrode layer and the second magnetic domain control layer; and forming an upper magnetic shield layer on the upper portion of the upper insulating gap layer.

The step of forming the second underlying layer and the second magnetic domain control layer may further include forming a second electrode layer.

In accordance with another aspect of the present invention, a read write separation type magnetic head includes a magnetoresistive head having a lower magnetic shield layer, an upper magnetic shield layer, a magnetoresistive stack having a pinned layer, a nonmagnetic conductive layer and a free layer placed between the lower magnetic shield layer and the upper magnetic shield layer, first magnetic domain control layers placed in the proximity of the free layer outside both ends of the magnetoresistive stack, first electrode layers placed on the upper portions of the first magnetic domain control layers, and second magnetic domain control layers placed outside both ends of the first magnetic domain control layers; and an inductive magnetic recording head provided in the proximity of the magnetoresistive head.

Preferably, the magnetoresistive head has second electrode layers on the upper portions of the second domain control layers.

The inductive magnetic recording head includes a lower magnetic pole piece, an upper magnetic pole piece, a coil placed between the lower magnetic pole piece and the upper magnetic pole piece, and a write gap comprised of the lower magnetic pole piece and the upper magnetic pole piece.

The present invention can provide a magnetoresistive head excellent in magnetic domain control properties and resistant to disturbances, and manufacturing method thereof. Also, the invention can provide a read write separation type magnetic head having a magnetoresistive head excellent in magnetic domain control properties and resistant to disturbances.

DETAILED DESCRIPTION OF THE INVENTION

Figure 2:
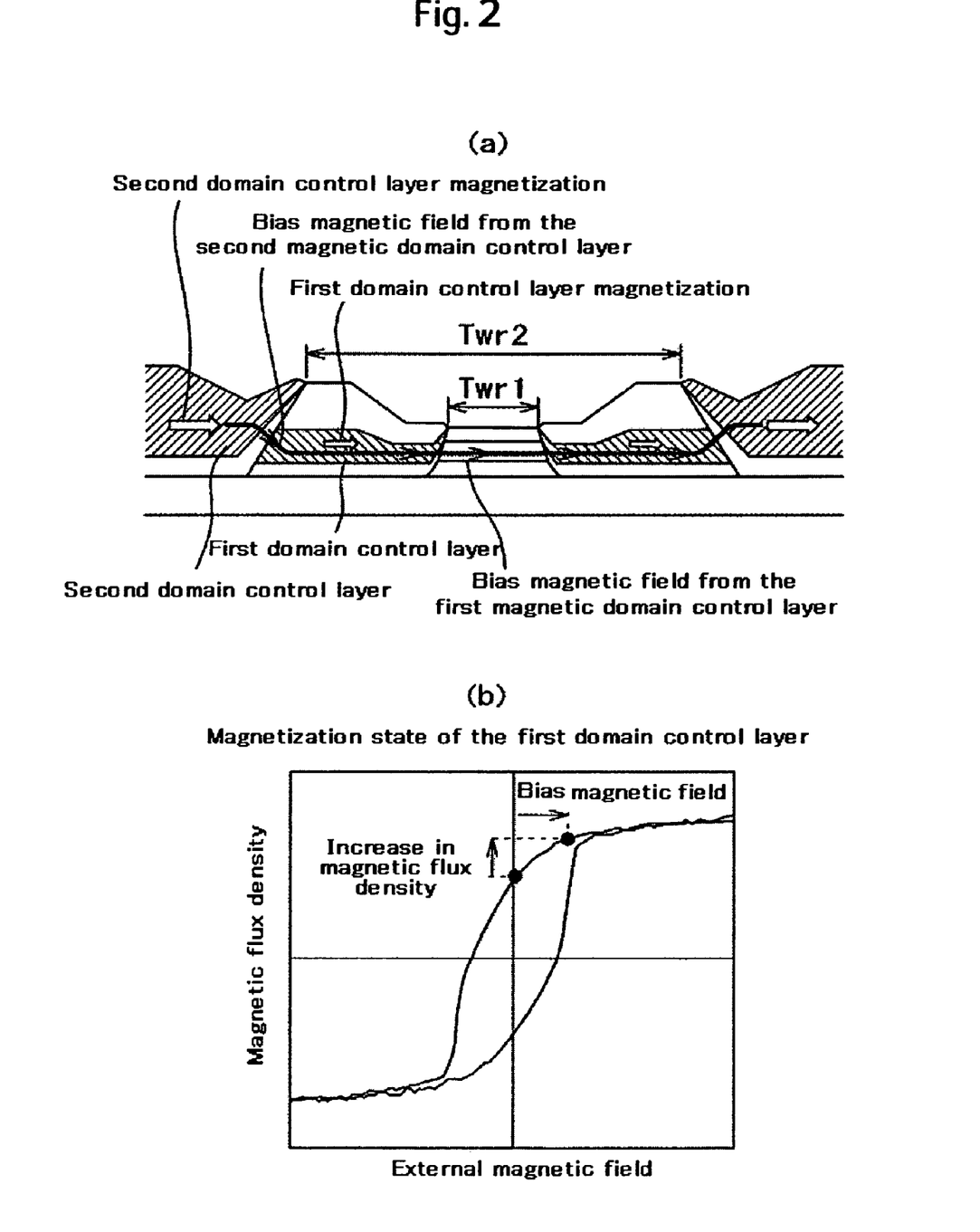
FIGS. 2(a) and 2(b) are diagrams indicating a fundamental construction and operation principle of a magnetic domain control layer of the present invention.

FIG. 2(a) shows the fundamental construction and operation principle of the two-stage magnetic domain control layer according to an embodiment of the present invention. A first magnetic domain control layer adopts an intermediate stop structure, and is formed such that the track width is Twr1. Thereafter, outside the first magnetic domain control layer is formed a second magnetic domain control layer. The second magnetic domain control layer placed outside the first magnetic domain control layer provides the first magnetic domain control layer with an external bias magnetic field. FIG. 2(b) indicates estimated magnetization curves of the first magnetic domain control layer when the first magnetic domain control layer is made thin, at only about 3 nm or less. A decreased amount of magnetization at the tip of the first magnetic domain control layer is polarized by the bias magnetic field and increased. This makes it possible to apply a strong bias magnetic field having a smaller dispersion to the free layer of the GMR sensor from the magnetic domain control layer.

The first magnetic domain control layer that is made thin has the anisotropic magnetic energy KuV (Ku: anisotropic magnetic energy per volume, V: volume of crystal grains) that is kept low, and is estimated to have a magnetization state that is weak for an external magnetic field or thermal turbulence; the second magnetic domain control layer can be made thick, so its anisotropic magnetic energy KuV can be set to be large. Accordingly, the magnetization of the second magnetic domain control layer can stably be constructed even when an external magnetic field or thermal turbulence is present; the magnetic binding of the second magnetic domain control layer and the first magnetic domain control layer is readily made to be strong. The stabilized magnetization of the second magnetic domain control layer also enables the stabilization of magnetization of the first magnetic domain control layer.

For the second magnetic domain control layer, its layer thickness and molding conditions are selected so as to endure magnetic disturbances or thermal turbulence, and further the amount of magnetization Br2t2 thereof is set larger than the amount of magnetization Br1t1 of the first magnetic domain control layer. The amount of magnetization of the second magnetic domain control layer is set by a factor of 2 to 5 as compared with the amount of magnetization of the first magnetic domain control layer. At this time, it was shown that an excess of magnetization of the second magnetic domain control layer is absorbed by the upper magnetic shield layer and has small effect on the magnetization process of the free layer without being applied to the free layer of the GMR sensor. In some cases, it is thought that the excess of magnetization of the second magnetic domain control layer gives the upper magnetic shield layer a bias magnetic field, thereby also contributing to the stability of the magnetic states of the upper magnetic shield layer.

Figure 4:
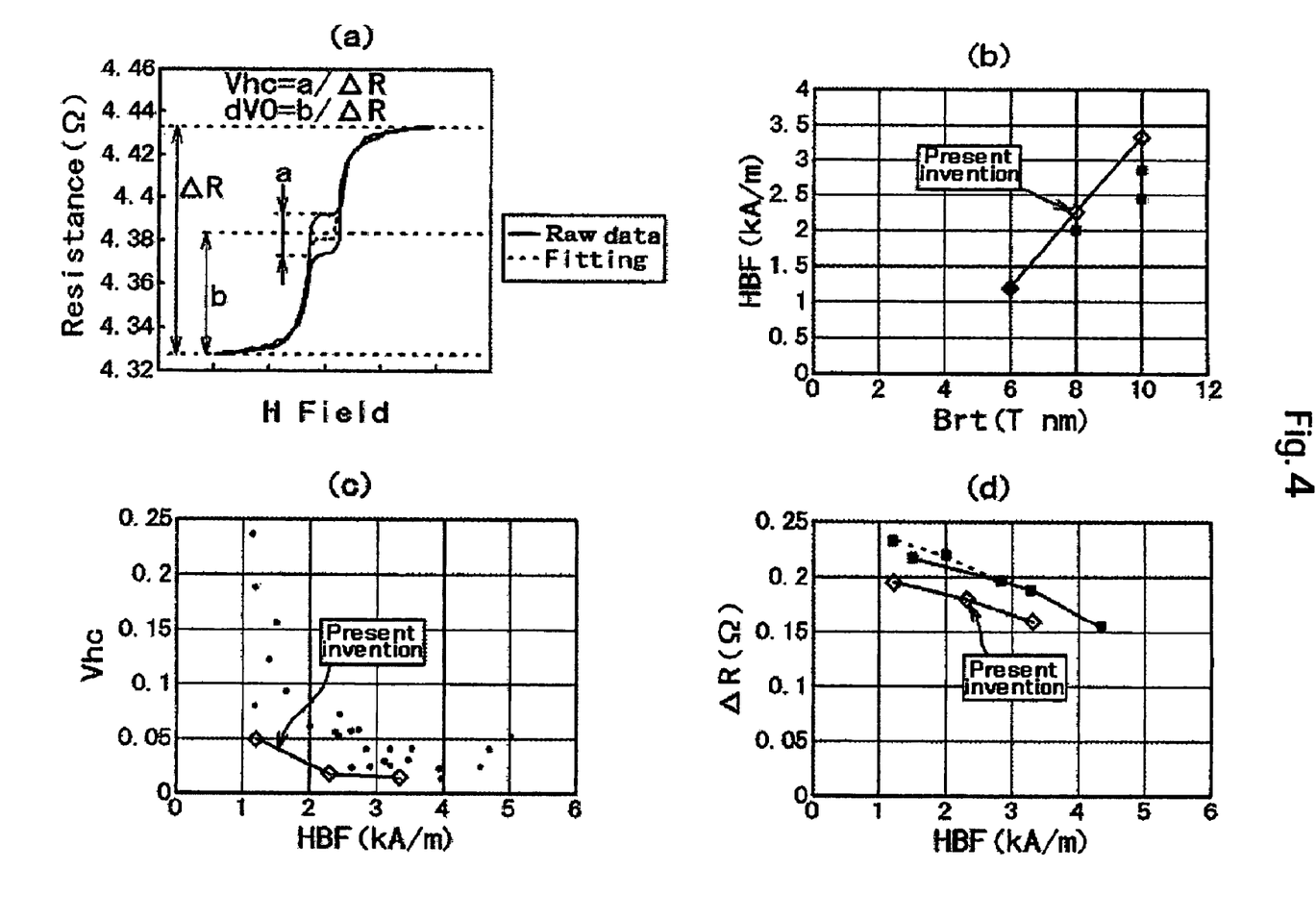
FIGS. 4(a) to 4(d) show graphs indicating the effects of the magnetoresistive head according to the first embodiment on the free layer transfer curve characteristic values.

In addition, constructing the track width dimension of the second magnetic domain control layer as narrow as possible increases the effect of stabilizing the magnetization of the first magnetic domain control layer. More specifically, as illustrated in FIG. 4(b) the bias magnetic field that is applied to the first magnetic domain control layer increases during small track width, thereby increasing the effect of the stabilization. Recently, TMR heads and CPP heads have been developed, and it would seem that the formation of the second magnetic layer outside an insulating magnetic layer of oxides not possessing an underlying layer as a first magnetic domain control layer is effective as well. In this case, however, the track width size of the second magnetic domain control layer needs to be configured as small as possible.

Figure 1:
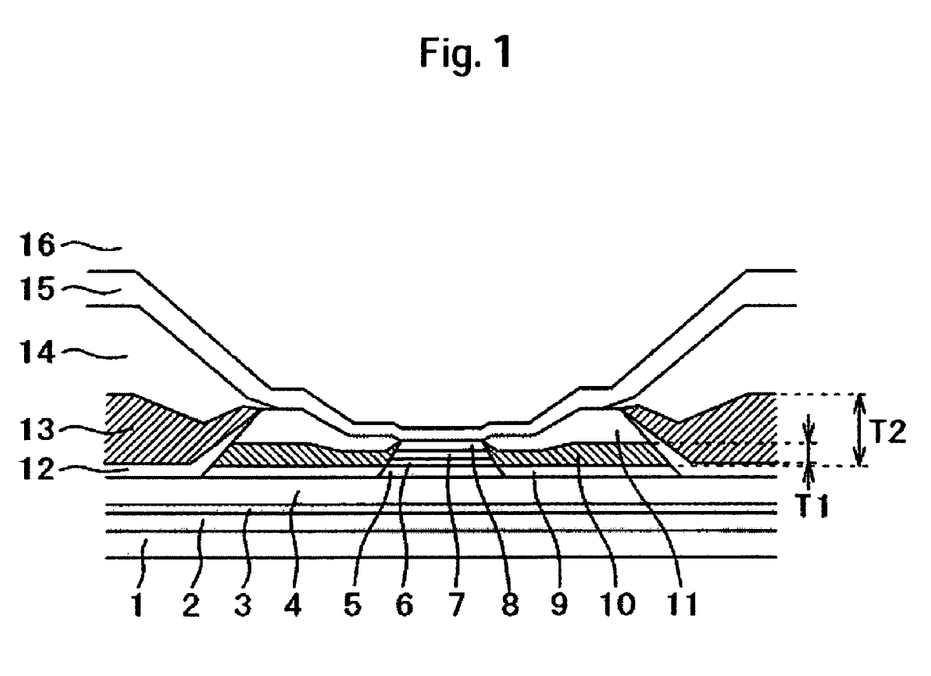
FIG. 1 is a sectional view of a magnetoresistive head according to a first embodiment of the present invention, as viewed from the air bearing surface.

Next, the construction of a magnetoresistive head according to a first embodiment of the present invention will be set forth with reference to FIG. 1. FIG. 1 is a sectional view as viewed from an air bearing surface (ABS surface). On a lower magnetic shield layer 1 comprising soft magnetic material such as the NiFe alloy is formed a lower insulating gap layer 2 comprising insulating material such as a $Al_2O_3$ compound. On the lower insulating gap layer 2 is formed a magnetoresistive stack. This figure is a construction that is referred to as a so-called single spin valve type in which an antiferromagnetic layer is placed at a lower position.

Next, each layer constituting the magnetoresistive stack will be described in accordance with the manufacturing process. First, on the lower insulating gap layer 2 is formed an underlying layer 3. This underlying layer 3 is composed of nonmagnetic materials such as Ta, and NiFeCr; the underlying layer may be either a single layer or have a laminated structure.

On underlying layer 3 is formed an antiferromagnetic layer 4. This antiferromagnetic layer 4 is composed of antiferromagnetic materials including PtMn and other substances.

On the antiferromagnetic layer 4 is formed a pinned layer 5. This pinned layer 5 is composed of a CoFe alloy, and other substances; the pinned layer may be either a single layer or have a laminated structure.

On the pinned layer 5 is formed a nonmagnetic conductive layer (nonmagnetic spacer layer) 6. This nonmagnetic spacer layer 6 is composed of a nonmagnetic conductive material such as Cu.

On the nonmagnetic spacer layer 6 is formed a free layer 7. The free layer 7 is composed of a NiFe alloy, a CoFe alloy, or other substances; the free layer may be either a single layer or have a laminated structure.

On the free layer 7 is formed a cap layer 8 comprising a nonmagnetic material such as Ta.

Each layer constituting the magnetoresistive stack is continuously and collectively formed by a multilayered thin film sputter film-forming apparatus within the same vacuum device.

Figure 3:
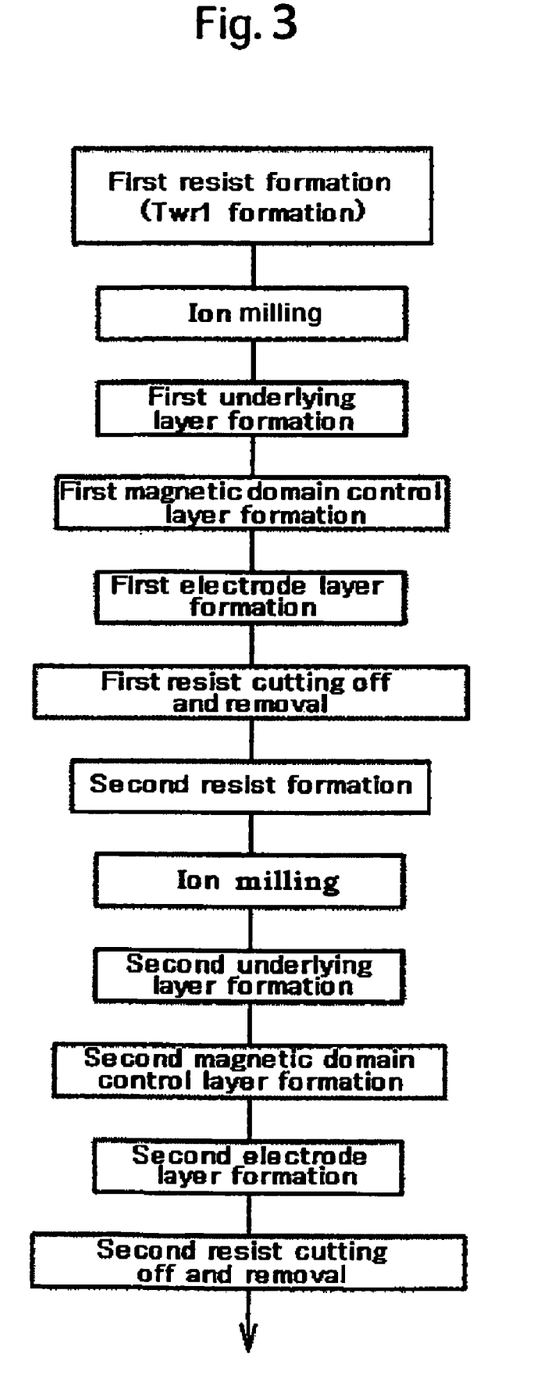
FIG. 3 is a step diagram showing the method for manufacturing the magnetoresistive head according to the first embodiment.

Thereafter, in accordance with the step as indicated in FIG. 3, a first magnetic domain control layer and a first electrode layer, a second magnetic domain control layer and a second electrode layer are formed. First of all, a first lift off resist layer is formed that determines the interval Twr1 of the first magnetic domain control layers and is removed by etching to the antiferromagnetic layer 4 of the magnetoresistive stack.

Then, a first underlying layer 9 comprising an NiTa amorphous alloy thin film, a Cr thin film and other films is formed. On this first underlying layer 9 is formed a first magnetic domain control layer 10 comprising a CoCrPt alloy, a CoPt alloy, CoFe alloy, or other alloys. On this first magnetic domain control layer 10 is formed a first electrode layer 11 for passing a current through the magnetoresistive stack. The first electrode layer 11 is composed of Cr, Ta, a Ta alloy, Au, Rh or other substances, and may be a single layer or have a laminated structure. Subsequently, the first lift off resist layer is removed.

Thereafter, a second lift off resist layer is formed that determines the interval Twr2 of the second magnetic domain control layers and an area not covered with the second lift off resist layer is remove by etching to the antiferromagnetic layer 4 of the magnetoresistive stack.

Thereafter, formed is a second underlying layer 12 composed of an NiTa amorphous alloy, Cr, or other substances.

On this second underlying layer 12 is formed a second magnetic domain control layer 13 composed of a CoCrPt alloy, a CoPt alloy, or other alloys.

On the second magnetic domain control layer 13 is formed a second electrode layer 14 for passing a current through the magnetoresistive stack. This second electrode layer 14 is composed of Cr, Ta, a TaW alloy, Au, Rh, or other substances, and may be a single layer or have a laminated structure. In addition, on this second electrode layer 14 may be formed a protecting layer composed of insulating material such as an $Al_2O_3$—$SiO_2$ compound.

Subsequently, the second lift off resist layer is removed, and is formed an upper insulating gap layer 15 composed of insulating material such as an $Al_2O_3$ compound.

On the upper insulating gap layer 15 is formed an upper magnetic shield layer 16 composed of soft magnetic material such as an NiFe alloy.

Next, a trial product of a two-stage hard bias structure on the basis of the first embodiment above was fabricated using the manufacturing method and subjected to head evaluation. In this case, the two-stage magnetic domain control layer used in the trial product is made use of a first magnetic domain control layer $Co_{90}Pt_{10}$ (Br1=1.15T, Hc1=80 kA/m, layer thickness t1=5.0 nm); the second magnetic domain control layer utilized $Co_{83.5}Cr_{2.5}Pt_{14.0}$ (Br2=1.14T, Hc2=99 kA/m, layer thickness t2=30.9 nm). The interval Twr1 of the first magnetic domain control layer is 90 nm; the interval Twr2 of the second magnetic domain control layer is 325 nm. Additionally, the trial product having the conventional construction for comparison uses a magnetic domain control layer $Co_{90}Pt_{10}$ (Br1=1.15T, Hc1=80 kA/m, layer thickness t1=6.4 nm) and has a track width interval Twr1 of 90 nm.

For the examination of the effect, the measurement of a transfer curve equivalent to that described in Patent Document 2 was carried out and the dependency of the magnetoresistive effect on an external magnetic field was evaluated. FIG. 4(a) shows a measurement example of an actual transfer curve and an example in which fitting was performed on the transfer curve for the analysis of numerical values. The fitting is carried out for the evaluation of values of the HBF (Hard Bias Direction Field), assuming that the GMR resistance change rate is proportional to $Hex/(Hex^2+HBF^2)^{1/2}$. The HBF value represents the magnetic field intensity of the free layer of the GMR layer. The free layer experiences the intensity in the track width direction. The intensity would seem to primarily consist of the intensities from the inductive magnetic anisotropy field, the shape anisotropy magnetic field from a pattern shape, the anisotropy field generated from the stress-strain effect and the magnetic field intensity from the magnetic domain control layer. When GMR free layers are similar and their pattern sizes are the same, the HBF value is thought to be determined by the bias magnetic field given by the magnetic domain control layer, so the evaluation of the HBF value would seem to make it possible to evaluate the effective bias magnetic field from the magnetic domain control layer.

Additionally, the index ΔR that indicates the output of a transfer curve corresponds to the output of a read head (head sensitivity). The index Vhc that represents the hysteresis of a transfer curve corresponds to noise properties (waveform variation, etc.) of a read head. When ΔR is large, the output of a read head is large; when Vhc is small, the noise properties are excellent. Accordingly, when magnetoresistive stacks (underlying layer, antiferromagnetic layer, pinned layer, nonmagnetic spacer layer, free layer, cap layer) are similar, the evaluation of Vhc can lead to the evaluation of whether the magnetic domain control of the free layer is appropriate.

FIG. 4(b) indicates the results of plotting the HBF values for a two-stage magnetic domain control layer (present invention) against values of residual magnetization Brt1 of a first magnetic domain control layer. The effective HBF values of the two-stage magnetic domain control layer (present invention) are slightly increased as compared with those of the magnetic domain control layer of a conventional structure. FIGS. 4(c) and 4(d) show graphs when the variations of the Vhc values and ΔR values were plotted against the HBF values. The graphs indicate that the Vhc values are small and the ΔR values are slightly smaller, for the two-stage magnetic domain control layer (present invention), as compared with those for the magnetic domain control layer of the conventional structure. The behaviors of these transfer curves show that the magnetization dispersion in the GMR layer end of the first magnetic domain control layer is small depending on the structure of the two-stage magnetic domain control layer, whereby the magnetic domain control properties are improved.

Figure 5:
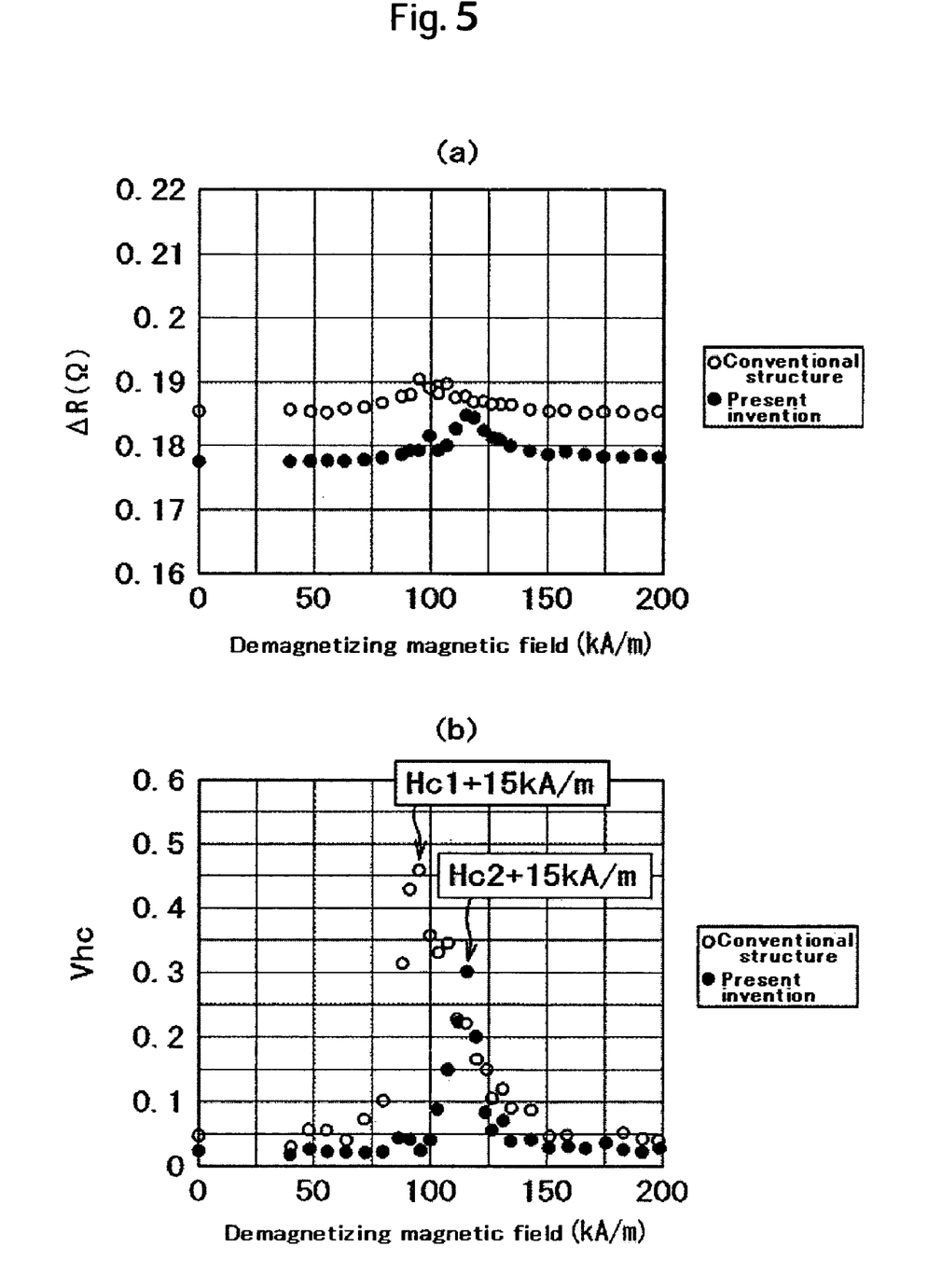
FIGS. 5(a) and 5(b) show graphs indicating the dependency of the transfer curve characteristic values $\Delta R$ and the Vhc values of the magnetoresistive heads of a conventional structure and the present invention on demagnetizing magnetic fields.

FIGS. 5(a) and 5(b) show the measurements of the dependency of the Vhc and ΔR on the demagnetizing magnetic field. The measurements involve polarizing the trial products in the track width direction, and then applying the demagnetizing magnetic field in the reverse for the evaluation of the transfer curves for the purpose of evaluation of effects of the strengths of the trial products on an external magnetic field. Making an increase in the demagnetizing magnetic field for the conventional structure rapidly increased the Vhc, to 0.46 at a demagnetizing magnetic field of 95 kA/m, while an increase in the Vhc for the structure of the present invention was gradual, to 0.30 at a demagnetizing magnetic field of 115 kA/m. The study on these demagnetizing magnetic fields revealed that the demagnetizing magnetic field value corresponds to a coercivity value Hc1+15 kA/m in an even portion for the conventional structure, or corresponds to a coercivity value Hc2+15 kA/m in the second magnetic domain control layer for the two-stage magnetic domain control layer structure. The fact that the demagnetizing magnetic fields are 15 kA/m larger than the coercivity value of the single layer would seem to be because the magnetic field is absorbed by the magnetic shield layers of the upper and lower portions. Additionally, when the magnetic domain control layer has a two-stage magnetic domain control layer structure, the demagnetizing magnetic field is shown to correspond to the coercivity value of the second magnetic domain control layer, so that the formation of a magnetic thin film of a large coercivity value for the second magnetic domain control layer clearly indicates the capability of the formation of a magnetic domain control layer structure strong in resistance magnetic field. Also, for the ΔR value, making an increase in the demagnetizing magnetic field increases the ΔR values both for the conventional structure and also the structure of the present invention, with the ΔR value being 0.190 Ω at 95 kA/m of the demagnetizing magnetic field for the conventional structure and being 0.185 Ω at 115 kA/m of the demagnetizing magnetic field for the structure of the present invention.

Figure 6:
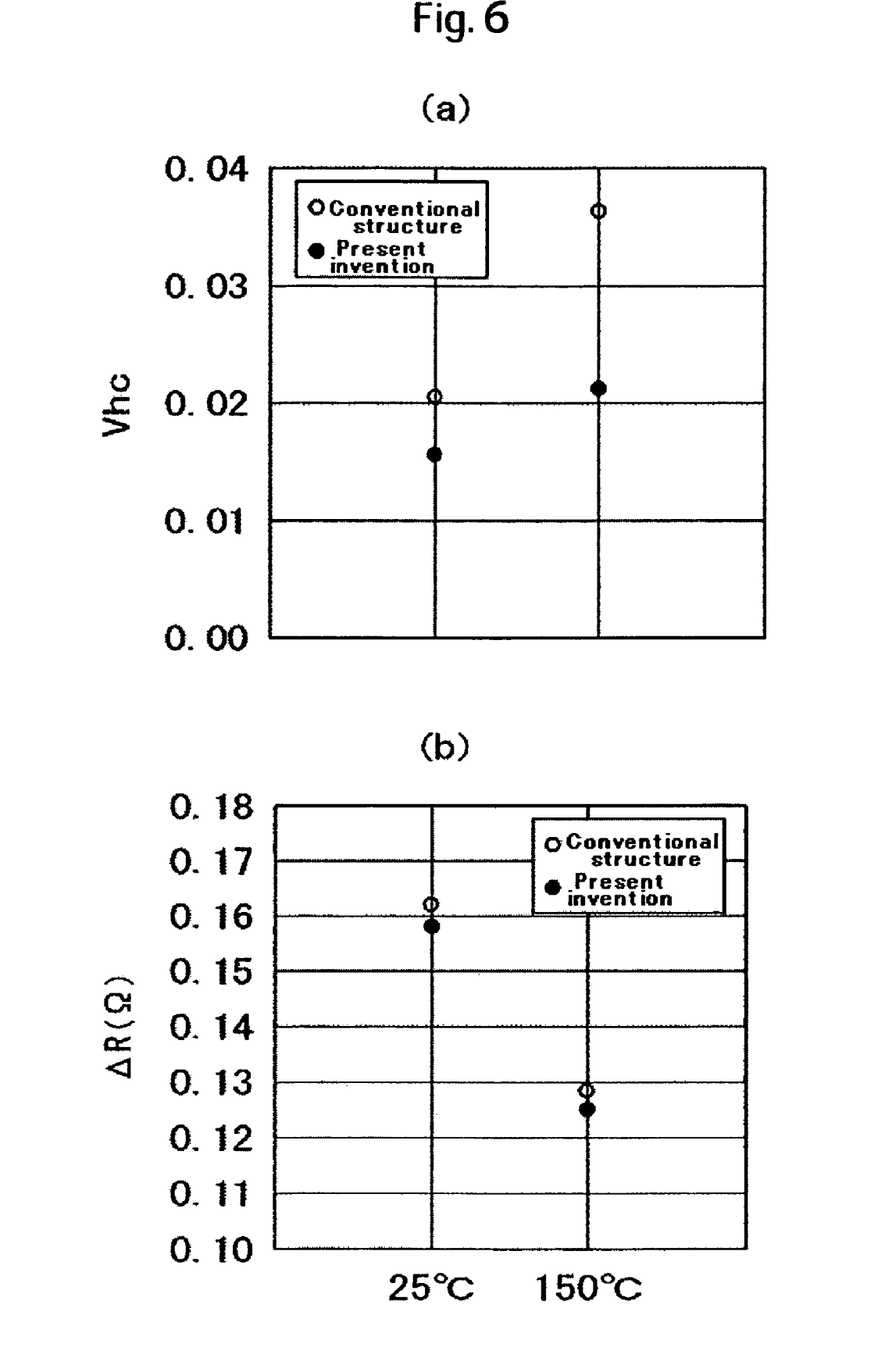
FIGS. 6(a) and 6(b) show graphs indicating changes during temperature rises of the transfer curve characteristic value Vhc and $\Delta R$ value of the conventional structure and the present invention.

FIGS. 6(a) and 6(b) are graphs indicating the results when the magnetoresistive sensors (without the upper magnetic shield layer) of the conventional structure and the present invention were evaluated for the transfer curves at a room temperature of 25° C. and at an elevated temperature of 150° C., with the Vhc and ΔR values being determined and compared. The Vhc values are 0.020 for the conventional structure and 0.016 for the structure of the present invention, at a room temperature of 25° C., so the structure of the present invention is excellent in magnetic domain control properties. On the other hand, at a high temperature of 150° C., the Vhc values are 0.036 for the conventional structure and 0.021, which is very small, for the structure of the present invention, suggesting that the structure of the present invention is stable in heat. The ΔR values are almost the same both for the conventional structure and the structure of the present invention, not depending on the temperature. The GMR layer structure is thought to greatly contribute to the temperature dependency of ΔR.

Consequently, it has been shown that the structure of the first embodiment of the present invention provides a magnetoresistive head excellent in magnetic domain control properties and stable in disturbances such as heat and the demagnetizing magnetic field.

Figure 7:
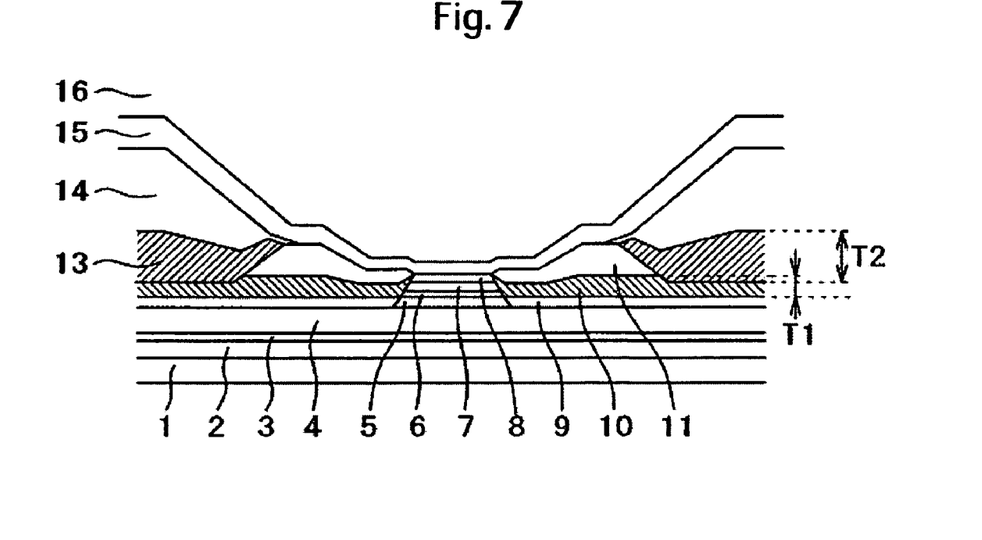
FIG. 7 is a sectional view of the magnetoresistive head according to a second embodiment of the present invention, as viewed from the air bearing surface side.

FIG. 7 is a sectional view of a magnetoresistive head according to a second embodiment of the present invention, viewed from the ABS side. In the first embodiment above, when the second magnetic domain control layer 13 is formed, the metal amorphous seed layer and the underlying layer 12 are formed, whereas a metal amorphous seed layer and an underlying layer are not formed. In other words, after a second lift off resist is formed, etching by the ion milling of a first magnetic domain control layer 10 is stopped in progress, and then a second magnetic domain control layer 13 is directly formed thereon. The Co alloy thin film of the second magnetic domain control layer 13 is crystal grown by epitaxy on the Co alloy thin film of the first magnetic domain control layer 10, and its magnetic properties are rarely decreased greatly. However, although the coercivity Hc2 of the second magnetic domain control layer 13 is smaller than the case in the first embodiment, an effect equivalent to the case in the first embodiment is obtained. The second embodiment directly forms the second magnetic domain control layer 13 on the first magnetic domain control layer 10, so the second embodiment has the effect of being capable of reducing the number of manufacturing steps as compared with the first embodiment.

Figure 8:
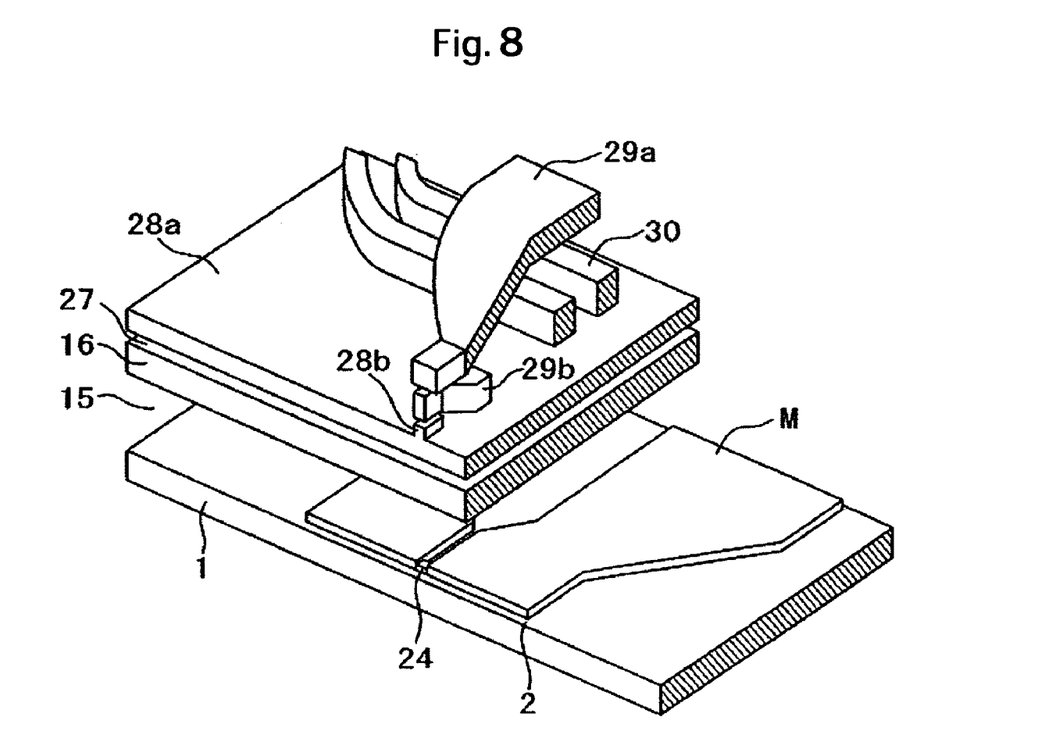
FIG. 8 is a perspective view of a read write separation type head in which a magnetoresistive head of the present invention is embedded.

FIG. 8 is a perspective, schematic view of a read write separation type head in which the magnetoresistive head according to the embodiment is embedded. The magnetoresistive head includes, as described supra, a lower magnetic shield layer 1, a lower insulating gap layer 2, a magnetoresistive stack 24, a magnetic domain control stack M placed close to the both end slopes of the magnetoresistive stack 24, and an upper magnetic shield layer 16 on the upper portions of the magnetoresistive stack 24 and the magnetic domain control stack M via an upper insulating gap layer 15. An inductive recording head is disposed on the upper portion of the upper magnetic shield layer 16 through an insulating layer 27. The inductive recording head includes a lower magnetic layer 28a, an upper magnetic layer 29a, and a coil 30 disposed therebetween; between a protruding lower magnetic pole piece 28b formed on a portion of the lower magnetic layer 28a and an upper magnetic pole piece 29b placed at the tip of the upper magnetic layer 29a is formed a recording gap that carries out recording operation. The tip portion of the upper magnetic layer 29a is recessed from the air bearing surface and is recessed from the upper magnetic pole piece 29b. Separating the upper magnetic layer 29a and the upper magnetic pole piece 29b causes the magnetic flux generated within the magnetic pole piece to be effectively collected in the tip portion by the current flowing through the coil 30, thereby being capable of improving recording characteristics. This write head may also be a recording head for perpendicular recording, having the primary magnetic pole piece and a secondary pole piece.

Carried out was a trial production of a read write separation type magnetic head having the structure as indicated in FIG. 8. More specifically, the trial production involved performing a trial production to which the two-stage magnetic domain control layer structure of the embodiment is applied in the formation of the magnetic domain control stack M, forming the recording head, and subsequently subjecting the magnetic recording medium to magnetic recording read operation testing by use of a read write tester to confirm the operation equivalent to that of the normal head. In addition, it was confirmed that the adoption of the present structure enables the formation of a magnetic head that is readily read output obtainable, and small in output variation and noises.

It is to be understood that the above description is intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A magnetoresistive head comprising:
a lower magnetic shield layer;
an upper magnetic shield layer;
a magnetoresistive stack having a pinned layer, a nonmagnetic conductive layer and a free layer placed between the lower magnetic shield layer and the upper magnetic shield layer;
first magnetic domain control layers placed in proximity of the free layer outside both ends of the magnetoresistive stack;
first electrode layers placed on upper portions of the first magnetic domain control layers; and
second magnetic domain control layers placed outside both ends of the first magnetic domain control layers,
wherein the first magnetic domain control layers and the second magnetic domain control layers have a same magnetizing direction.

2. A magnetoresistive head according to claim 1, wherein a layer thickness t1 of one of the first magnetic domain control layers and a layer thickness t2 of a corresponding one of the second magnetic domain control layers have the relation t1<t2.

3. A magnetoresistive head according to claim 1,
wherein the magnetizing direction of the second magnetic domain control layer which is same as the magnetizing direction of the first magnetic domain control layer is further inclined by a predetermined angle.

4. A magnetoresistive head comprising:
a lower magnetic shield layer;
an upper magnetic shield layer;
a magnetoresistive stack having a pinned layer, a nonmagnetic conductive layer and a free layer placed between the lower magnetic shield layer and the upper magnetic shield layer;
first magnetic domain control layers placed in proximity of the free layer outside both ends of the magnetoresistive stack;
first electrode layers placed on upper portions of the first magnetic domain control layers; and
second magnetic domain control layers placed outside both ends of the first magnetic domain control layers,
wherein the magnetoresistive head has second electrode layers on upper portions of the second magnetic domain control layers.

5. A magnetoresistive head comprising:
a lower magnetic shield layer;
an upper magnetic shield layer;
a magnetoresistive stack having a pinned layer, a nonmagnetic conductive layer and a free layer placed between the lower magnetic shield layer and the upper magnetic shield layer;
first magnetic domain control layers placed in proximity of the free layer outside both ends of the magnetoresistive stack;
first electrode layers placed on upper portions of the first magnetic domain control layers; and
second magnetic domain control layers placed outside both ends of the first magnetic domain control layers,
wherein relations between a residual magnetic flux density Br1 and a coercivity Hc1 of one of the first magnetic domain control layers and a residual magnetic flux density Br2 and a coercivity Hc2 of a corresponding one of the second magnetic domain control layers are given by the relations Br1>Br2 and Hc1<Hc2.

6. A magnetoresistive head comprising:
a lower magnetic shield layer;
an upper magnetic shield layer;

a magnetoresistive stack having a pinned layer, a nonmagnetic conductive layer and a free layer placed between the lower magnetic shield layer and the upper magnetic shield layer;

first magnetic domain control layers placed in proximity of the free layer outside both ends of the magnetoresistive stack;

first electrode layers placed on upper portions of the first magnetic domain control layers; and second magnetic domain control layers placed outside both ends of the first magnetic domain control layers, wherein a relationship between a Co composition $X_{Co1}$ of one of the first magnetic domain control layers and a Co composition $X_{Co2}$ of a corresponding one of the second magnetic control layers is given by the relation $X_{Co1} > X_{Co2}$.

7. A magnetoresistive head comprising:
a lower magnetic shield layer;
an upper magnetic shield layer;
a magnetoresistive stack having a pinned layer, a nonmagnetic conductive layer and a free layer placed between the lower magnetic shield layer and the upper magnetic shield layer;
first magnetic domain control layers placed in proximity of the free layer outside both ends of the magnetoresistive stack;
first electrode layers placed on upper portions of the first magnetic domain control layers; and
second magnetic domain control layers placed outside both ends of the first magnetic domain control layers.
wherein:
the magnetoresistive stack has an underlying layer in the lower portion,
the first magnetic domain control layer has a first underlying layer in a lower portion of the magnetoresistive head,
the first underlying layer is disposed on any surface within a range of from an undersurface of the underlying layer to an undersurface of the free layer,
the second magnetic domain control layer has a second underlying layer in the lower portion, and
the second underlying layer is disposed on any surface within a range of from the undersurface of the underlying layer to a top surface of the first magnetic domain control layer.

8. A magnetoresistive head comprising:
a lower magnetic shield layer;
an upper magnetic shield layer;
a magnetoresistive stack having a pinned layer, a nonmagnetic conductive layer and a free layer placed between the lower magnetic shield layer and the upper magnetic shield layer;
first magnetic domain control layers placed in proximity of the free layer outside both ends of the magnetoresistive stack;
first electrode layers placed on upper portions of the first magnetic domain control layers; and
second magnetic domain control layers placed outside both ends of the first magnetic domain control layers,
wherein:
the magnetoresistive stack has an underlying layer in a lower portion of the magnetoresistive head,
the first magnetic domain control layer has a first underlying layer in the lower portion,
the first underlying layer is disposed on any surface within a range of from an undersurface of the underlying layer to an undersurface of the free layer, and the second magnetic domain control layer is disposed on any surface within a range of from a top surface of the first underlying layer to a top surface of the first magnetic domain control layer.

9. A magnetoresistive head comprising:
a lower magnetic shield layer;
an upper magnetic shield layer;
a magnetoresistive stack having a pinned layer, a nonmagnetic conductive layer and a free layer placed between the lower magnetic shield layer and the upper magnetic shield layer;
first magnetic domain control layers placed in proximity of the free layer outside both ends of the magnetoresistive stack;
first electrode layers placed on upper portions of the first magnetic domain control layers; and
second magnetic domain control layers placed outside both ends of the first magnetic domain control layers,
wherein:
the magnetoresistive stack has an underlying layer in a lower portion of the magnetoresistive head,
the first magnetic domain control layer is disposed on any surface within a range of from an undersurface of the underlying layer to an undersurface of the free layer,
the second magnetic domain control layer has a second underlying layer in the lower portion, and
the second underlying layer is formed on any surface within a range of from the undersurface of the underlying layer to a top surface of the first magnetic domain control layer.

10. A magnetoresistive head comprising:
a lower magnetic shield layer;
an upper magnetic shield layer;
a magnetoresistive stack having a pinned layer, a nonmagnetic conductive layer and a free layer placed between the lower magnetic shield layer and the upper magnetic shield layer;
first magnetic domain control layers placed in proximity of the free layer outside both ends of the magnetoresistive stack;
first electrode layers placed on upper portions of the first magnetic domain control layer; and
second magnetic domain control layers placed outside both ends of the first magnetic domain control layers,
wherein the second magnetic domain control layer is placed on the outer end of the first magnetic domain control layer.

11. A method for manufacturing a magnetoresistive head, comprising:
forming a lower insulating gap layer on an upper portion of a lower magnetic shield layer;
layer-forming on the upper portion of the lower magnetic shield layer a magnetoresistive stack having an underlying layer, an antiferromagnetic layer, a pinned layer, a nonmagnetic spacer layer and a free layer, and then forming a first lift off resist layer on a portion of the magnetoresistive stack;
cutting off an area not covered with the first lift off resist layer to any surface within a range of from an undersurface of the underlying layer to a lower surface of the free layer of the magnetoresistive stack, and removing the area;
forming a first underlying layer, a first magnetic domain control layer and a first electrode layer in the area not covered with the first lift off resist layer;
removing the first lift off resist layer;

forming a second lift off resist layer on portions of upper portions of the magnetoresistive stack and the first electrode layer;

cutting off an area not covered with the second lift off resist layer to any surface within a range of from the undersurface of the underlying layer to a top surface of the magnetic domain control layer of the magnetoresistive stack, and removing the area;

forming a second underlying layer and a second magnetic domain control layer in the area not covered with the second lift off resist layer;

removing the second lift off resist layer;

forming an upper insulating gap layer over the upper portion of the magnetoresistive stack, the second electrode layer and the second magnetic domain control layer; and forming an upper magnetic shield layer on an upper portion of the upper insulating gap layer.

12. A method for manufacturing a magnetoresistive head according to claim 11, wherein forming the second underlying layer and the second magnetic domain control layer further comprises forming a second electrode layer.

13. A read write separation type magnetic head, comprising:
  a magnetoresistive head including,
  a lower magnetic shield layer;
  an upper magnetic shield layer;
  a magnetoresistive stack having a pinned layer, a nonmagnetic conductive layer and a free layer placed between the lower magnetic shield layer and the upper magnetic shield layer;
  first magnetic domain control layers placed in proximity of free layer outside both ends of the magnetoresistive stack;
  first electrode layers placed on upper portions of the first magnetic domain control layers; and
  second magnetic domain control layers placed outside both ends of the first magnetic domain control layers; and
  an inductive magnetic recording head provided in the proximity of the magnetoresistive head,
  wherein the first magnetic domain control layers and the second magnetic domain control layers have a same magnetizing direction.

14. A read write separation type magnetic head according to claim 13, wherein the inductive magnetic recording head comprises a lower magnetic pole piece, an upper magnetic pole piece, the coil placed between the lower magnetic pole piece and the upper magnetic pole piece, and a write gap comprised of the lower magnetic pole piece and the upper magnetic pole piece.

15. A read write separation type magnetic head according to claim 13, wherein a layer thickness t1 of one of the first magnetic domain control layers and a layer thickness t2 of a corresponding one of the second magnetic domain control layers have the relation t1<t2.

16. A magnetoresistive head according to claim 13,
  wherein the magnetizing direction of the second magnetic domain control layer which is same as the magnetizing direction of the first magnetic domain control layer is further inclined by a predetermined angle.

17. A read write separation type magnetic head, comprising:
  a magnetoresistive head including,
  a lower magnetic shield layer;
  an upper magnetic shield layer;
  a magnetoresistive stack having a pinned layer, a nonmagnetic conductive layer and a free layer placed between the lower magnetic shield layer and the upper magnetic shield layer;
  first magnetic domain control layers placed in proximity of free layer outside both ends of the magnetoresistive stack;
  first electrode layers placed on upper portions of the first magnetic domain control layers; and
  second magnetic domain control layers placed outside both ends of the first magnetic domain control layers; and
  an inductive magnetic recording head provided in the proximity of the magnetoresistive head,
  wherein the magnetoresistive head has second electrode layers on upper portions of the second domain control layers.

18. A read write separation type magnetic head, comprising:
  a magnetoresistive head including,
  a lower magnetic shield layer;
  an upper magnetic shield layer;
  a magnetoresistive stack having a pinned layer, a nonmagnetic conductive layer and a free layer placed between the lower magnetic shield layer and the upper magnetic shield layer;
  first magnetic domain control layers placed in proximity of free layer outside both ends of the magnetoresistive stack;
  first electrode layers placed on upper portions of the first magnetic domain control layers; and
  second magnetic domain control layers placed outside both ends of the first magnetic domain control layers; and
  an inductive magnetic recording head provided in the proximity of the magnetoresistive head,
  wherein relations between a residual magnetic flux density Br1 and a coercivity Hc1 of one of the first magnetic domain control layers and a residual magnetic flux density Br2 and a coercivity Hc2 of a corresponding one of the second magnetic domain control layers are given by the relations Br1>Br2 and Hc1<Hc2.

19. A read write separation type magnetic head, comprising:
  a magnetoresistive head including,
  a lower magnetic shield layer;
  an upper magnetic shield layer;
  a magnetoresistive stack having a pinned layer, a nonmagnetic conductive layer and a free layer placed between the lower magnetic shield layer and the upper magnetic shield layer;
  first magnetic domain control layers placed in proximity of free layer outside both ends of the magnetoresistive stack;
  first electrode layers placed on upper portions of the first magnetic domain control layers; and
  second magnetic domain control layers placed outside both ends of the first magnetic domain control layers; and
  an inductive magnetic recording head provided in the proximity of the magnetoresistive head,
  wherein a relationship between a Co composition $X_{Co1}$ of one of the first magnetic domain control layers and a Co composition $X_{Co2}$ of a corresponding one of the second magnetic control layers is given by the relation $X_{Co1}>X_{Co2}$.

20. A read write separation type magnetic head, comprising:
  a magnetoresistive head including,
  a lower magnetic shield layer;

an upper magnetic shield layer;
a magnetoresistive stack having a pinned layer, a nonmagnetic conductive layer and a free layer placed between the lower magnetic shield layer and the upper magnetic shield layer;
first magnetic domain control layers placed in proximity of free layer outside both ends of the magnetoresistive stack;
first electrode layers placed on upper portions of the first magnetic domain control layers; and
second magnetic domain control layers placed outside both ends of the first magnetic domain control layers; and
an inductive magnetic recording head provided in the proximity of the magnetoresistive head,
wherein:
the magnetoresistive stack has an underlying layer in the lower portion,
the first magnetic domain control layer has a first underlying layer in a lower portion of the magnetoresistive head,
the first underlying layer is disposed on any surface within a range of from an undersurface of the underlying layer to an undersurface of the free layer,
the second magnetic domain control layer has a second underlying layer in the lower portion, and
the second underlying layer is disposed on any surface within a range of from an undersurface of the underlying layer to a top surface of the first magnetic domain control layer.

21. A read write separation type magnetic head, comprising:
a magnetoresistive head including,
a lower magnetic shield layer;
an upper magnetic shield layer;
a magnetoresistive stack having a pinned layer, a nonmagnetic conductive layer and a free layer placed between the lower magnetic shield layer and the upper magnetic shield layer;
first magnetic domain control layers placed in proximity of free layer outside both ends of the magnetoresistive stack;
first electrode layers placed on upper portions of the first magnetic domain control layers; and
second magnetic domain control layers placed outside both ends of the first magnetic domain control layers; and
an inductive magnetic recording head provided in the proximity of the magnetoresistive head,
wherein:
the magnetoresistive stack has an underlying layer in a lower portion of the magnetoresistive head,
the first magnetic domain control layer has a first underlying layer in the lower portion,
the first underlying layer is disposed on any surface within a range of from an undersurface of the underlying layer to an undersurface of the free layer, and
the second magnetic domain control layer is disposed on any surface within a range of from a top surface of the first underlying layer to a top surface of the first magnetic domain control layer.

22. A read write separation type magnetic head, comprising:
a magnetoresistive head including,
a lower magnetic shield layer;
an upper magnetic shield layer;
a magnetoresistive stack having a pinned layer, a nonmagnetic conductive layer and a free layer placed between the lower magnetic shield layer and the upper magnetic shield layer;
first magnetic domain control layers placed in proximity of free layer outside both ends of the magnetoresistive stack;
first electrode layers placed on upper portions of the first magnetic domain control layers; and
second magnetic domain control layers placed outside both ends of the first magnetic domain control layers; and
an inductive magnetic recording head provided in the proximity of the magnetoresistive head,
wherein:
the magnetoresistive stack has an underlying layer in a lower portion of the magnetoresistive head,
the first magnetic domain control layer is disposed on any surface within a range of from an undersurface of the underlying layer to an undersurface of the free layer,
the second magnetic domain control layer has a second underlying layer in the lower portion, and
the second underlying layer is formed on any surface within a range of from the undersurface of the underlying layer to a top surface of the first magnetic domain control layer.

* * * * *

UNITED STATES PATENT AND TRADEMARK OFFICE
CERTIFICATE OF CORRECTION

PATENT NO.        : 7,468,870 B2
APPLICATION NO. : 11/317881
DATED             : December 23, 2008
INVENTOR(S)       : Arasawa et al.

Page 1 of 1

It is certified that error appears in the above-identified patent and that said Letters Patent is hereby corrected as shown below:

Claim 10, column 16, line 43, please delete "layer" and insert -- layers --

Signed and Sealed this

Twenty-fourth Day of February, 2009

JOHN DOLL
*Acting Director of the United States Patent and Trademark Office*